(12) United States Patent
Wang

(10) Patent No.: US 12,166,053 B2
(45) Date of Patent: Dec. 10, 2024

(54) SEMICONDUCTOR DEVICE FOR RECEIVING AND COLLECTING INCLINED LIGHT

(71) Applicant: VisEra Technologies Company Limited, Hsin-Chu (TW)

(72) Inventor: Wei-Ko Wang, Taoyuan (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 104 days.

(21) Appl. No.: 17/198,549

(22) Filed: Mar. 11, 2021

(65) Prior Publication Data

US 2022/0293655 A1 Sep. 15, 2022

(51) Int. Cl.
*H01L 27/146* (2006.01)

(52) U.S. Cl.
CPC .. *H01L 27/14623* (2013.01); *H01L 27/14627* (2013.01)

(58) Field of Classification Search
CPC ......... H01L 27/14623; H01L 27/14627; H01L 27/14678
See application file for complete search history.

(56) References Cited

U.S. PATENT DOCUMENTS

| | | |
|---|---|---|
| 2001/0026322 A1 | 10/2001 | Takahashi et al. |
| 2009/0090937 A1 | 4/2009 | Park |

(Continued)

FOREIGN PATENT DOCUMENTS

| | | |
|---|---|---|
| CN | 103579272 A | 2/2014 |
| CN | 103765591 A | 4/2014 |

(Continued)

OTHER PUBLICATIONS

Office Action of its corresponding KR application No. 10-2021-0091701 issued on Nov. 16, 2022 with its English translation, pp. 27.

*Primary Examiner* — Nelson Garces
(74) *Attorney, Agent, or Firm* — MUNCY, GEISSLER, OLDS & LOWE, P.C.

(57) ABSTRACT

A semiconductor device is provided. The semiconductor device includes a substrate having photoelectric conversion elements. The semiconductor device also includes a first light-shielding layer disposed on the substrate and having first apertures. The semiconductor device further includes a light-adjusting structure disposed on the first light-shielding layer. Moreover, the semiconductor device includes a second light-shielding layer disposed on the light-adjusting structure and having second apertures. The semiconductor device also includes first light-condensing structures covering the second apertures. The semiconductor device further includes a third light-shielding layer disposed on the first light-condensing structure and having third apertures. Furthermore, the semiconductor device includes second light-condensing structures covering the third apertures. The semiconductor device also includes a first light-transmitting layer disposed between the second light-shielding layer and the third light-shielding layer. The refractive index of each first light-condensing structure and the refractive index of the first light-transmitting layer are different.

20 Claims, 4 Drawing Sheets

(56) References Cited

U.S. PATENT DOCUMENTS

| | | | |
|---|---|---|---|
| 2015/0109501 A1* | 4/2015 | Sekine | H01L 27/14627 438/69 |
| 2017/0338265 A1* | 11/2017 | Yoshiba | H04N 5/365 |
| 2019/0148434 A1* | 5/2019 | Hsu | H01L 27/14629 257/432 |
| 2019/0267414 A1 | 8/2019 | Otake et al. | |
| 2020/0045223 A1 | 2/2020 | Pang et al. | |
| 2020/0152683 A1 | 5/2020 | Akiyama et al. | |
| 2020/0176497 A1 | 6/2020 | Kim et al. | |
| 2020/0322507 A1 | 10/2020 | Chen et al. | |
| 2020/0365638 A1 | 11/2020 | Ford et al. | |
| 2021/0327941 A1* | 10/2021 | Lee | H01L 27/14685 |
| 2022/0050987 A1* | 2/2022 | Chiu | H01L 27/14627 |
| 2022/0260417 A1* | 8/2022 | Liu | G01J 1/44 |

FOREIGN PATENT DOCUMENTS

| | | | |
|---|---|---|---|
| CN | 105720065 A | 6/2016 | |
| CN | 111095285 A * | 5/2020 | ......... G06K 9/00026 |
| CN | 111430390 A | 7/2020 | |
| JP | 2001094086 | 4/2001 | |
| JP | 2004356269 | 12/2004 | |
| JP | 2006019627 | 1/2006 | |
| JP | 2006-120845 A | 5/2006 | |
| JP | 2009260445 | 11/2009 | |
| JP | 2012190926 | 10/2012 | |
| JP | 2015-167219 A | 9/2015 | |
| JP | 2020126978 | 8/2020 | |
| KR | 10-2005-0016285 | 2/2005 | |
| TW | 200818477 A | 4/2008 | |
| TW | 201236146 A | 9/2012 | |
| TW | 201238040 A | 9/2012 | |
| WO | WO2004/006336 | 1/2004 | |
| WO | WO2018/150902 | 8/2018 | |

* cited by examiner

SEMICONDUCTOR DEVICE FOR RECEIVING AND COLLECTING INCLINED LIGHT

BACKGROUND

Technical Field

Embodiments of the present disclosure relate to a semiconductor device, and in particular they relate to a semiconductor device for receiving and collecting inclined light.

Description of the Related Art

Semiconductor devices may be used in a variety of applications. For example, in recent years, semiconductor devices with photoelectric conversion elements have often been used as biometric devices, such as fingerprint identification devices, facial-recognition devices, iris scanners, and so on. Biometric devices may use people's intrinsic physical characteristics (e.g., a fingerprint, a face, an iris, and so on) to verify their identification, and they are usually used in portable devices (e.g., cell phones, tablet computers, notebooks, and so on). This application of biometric devices brings users a safe and convenient user experience.

However, existing biometric devices have not been satisfactory in every respect. For example, the biometric devices used for fingerprint recognition under the screen of cell phones or tablets must sense and collect inclined incident light, but the inclined incident light having larger incident angle (e.g., more than 50 degrees) may cause (comatic) aberrations, resulting in a lower quality image signal from the photoelectric conversion elements of the biometric devices.

BRIEF SUMMARY

In some embodiments of the present disclosure, the semiconductor device includes at least two light-condensing structures and one light-transmitting layer between the two light-condensing structures, and the refractive index of the lower light-condensing structure and the refractive index of the light-transmitting layer are different, so that the (comatic) aberrations may be effectively reduced, thereby improving the quality of the image signal from the photoelectric conversion elements of the semiconductor device.

In accordance with some embodiments of the present disclosure, a semiconductor device is provided. The semiconductor device includes a substrate having photoelectric conversion elements. The semiconductor device also includes a first light-shielding layer disposed on the substrate and having first apertures corresponding to the photoelectric conversion elements. The semiconductor device further includes a light-adjusting structure disposed on the first light-shielding layer. Moreover, the semiconductor device includes a second light-shielding layer disposed on the light-adjusting structure and having second apertures corresponding to the first apertures. The semiconductor device also includes first light-condensing structures disposed on the second light-shielding layer and covering the second apertures. The semiconductor device further includes a third light-shielding layer disposed on the first light-condensing structure and having third apertures corresponding to the second apertures. Furthermore, the semiconductor device includes second light-condensing structures disposed on the third light-shielding layer and covering the third apertures. The semiconductor device also includes a first light-transmitting layer disposed between the second light-shielding layer and the third light-shielding layer. The refractive index of each first light-condensing structure and the refractive index of the first light-transmitting layer are different.

In some embodiments, the refractive index of each first light-condensing structure is higher than the refractive index of the first light-transmitting layer.

In some embodiments, the first light-condensing structures are convex micro-lenses.

In some embodiments, the refractive index of each first light-condensing structure is between 1.5 and 2.5.

In some embodiments, the refractive index of each first light-condensing structure is lower than the refractive index of the first light-transmitting layer.

In some embodiments, the first light-condensing structures are concave micro-lenses.

In some embodiments, the refractive index of each first light-condensing structure is between 1.0 and 1.5.

In some embodiments, the central axis of each first light-condensing structure is separated from the central axis of each second light-condensing structure.

In some embodiments, each photoelectric conversion element corresponds to one first light-condensing structure and one second light-condensing structure.

In some embodiments, each first light-condensing structure covers one second aperture.

In some embodiments, the central axis of each first light-condensing structure overlaps the central axis of the corresponding second light-condensing structure.

In some embodiments, each first light-condensing structure covers at least two of the second apertures.

In some embodiments, each first light-condensing structure corresponds to one third aperture.

In some embodiments, the diameter of each first light-condensing structure is greater than the diameter of each second light-condensing structure.

In some embodiments, the semiconductor device further includes a second light-transmitting layer disposed between the light-adjusting structure and the second light-shielding layer.

In some embodiments, the refractive index of each first light-condensing structure and the refractive index each second light-condensing structure are different.

In some embodiments, the first light-transmitting layer is in direct contact with the second light-shielding layer, the first light-condensing structures, the third light-shielding layer, and the second light-condensing structures.

In some embodiments, the light-adjusting structure is an infrared cut-off filter.

In some embodiments, each first light-condensing structure and each second light-condensing structure have spherical, aspherical, or freeform surfaces.

In some embodiments, the photoelectric conversion elements are used for sensing incident lights, and each incident light has an incident angle in the range of 1 degree to 80 degrees.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
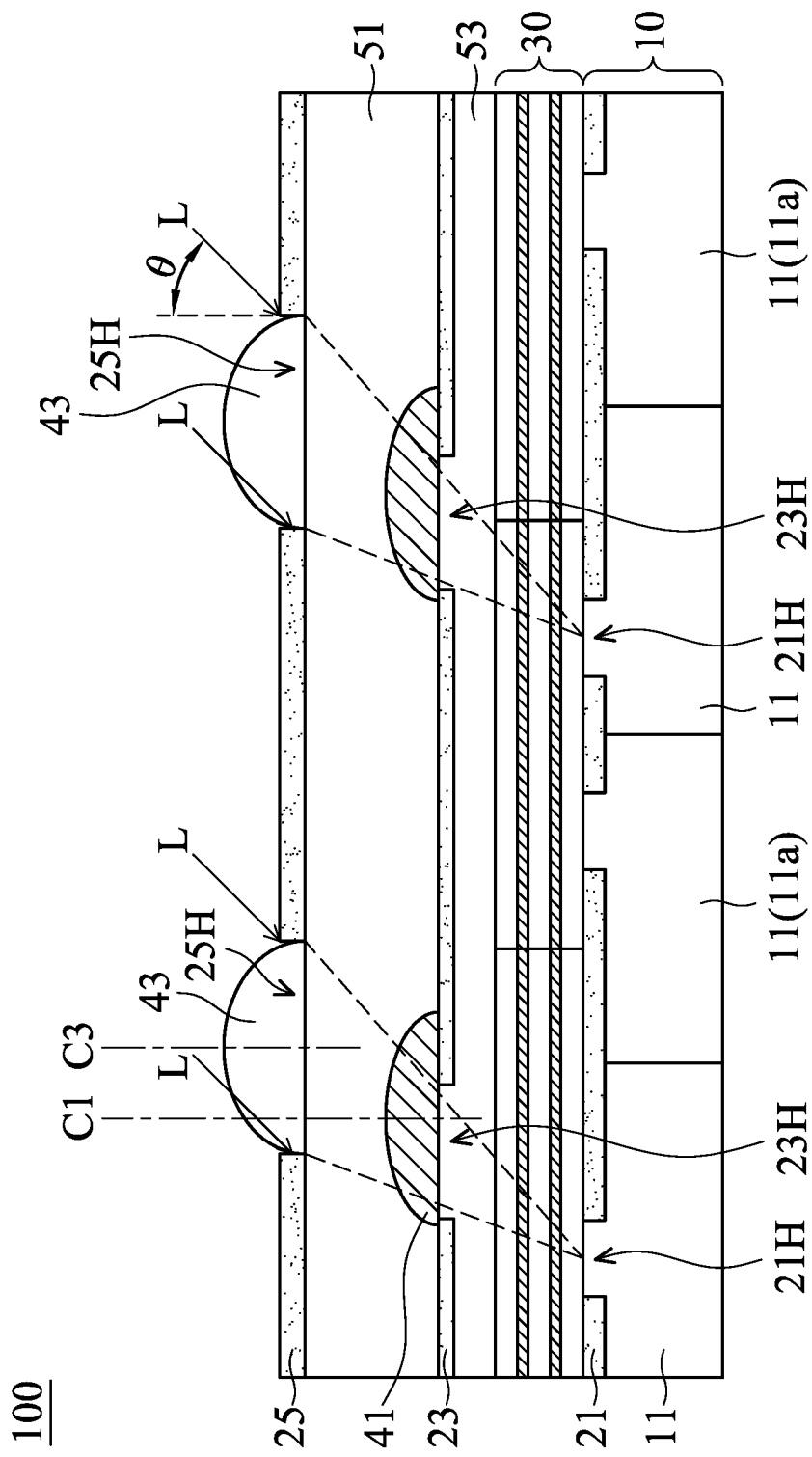
FIG. 1 is a partial cross-sectional view illustrating a semiconductor device according to an embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

The semiconductor device in the embodiments of the present disclosure may be used as a biometric device, such as a fingerprint identification device, but the present disclosure is not limited thereto. The semiconductor device shown in the embodiments of the present disclosure may also be applied to other suitable devices that sense and collect inclined incident light, depending on requirements.

FIG. 1 is a partial cross-sectional view illustrating a semiconductor device 100 according to an embodiment of the present disclosure. It should be noted that some components of the semiconductor device 100 may be omitted in FIG. 1, for the sake of brevity.

Referring to FIG. 1, in some embodiments, the semiconductor device 100 includes a substrate 10. For example, the material of the substrate 10 may include an elemental semiconductor (e.g., silicon, germanium), a compound semiconductor (e.g., tantalum carbide (TaC), gallium arsenide (GaAs), indium arsenide (InAs) or indium phosphide (InP)), an alloy semiconductor (e.g., silicon germanium (SiGe), silicon germanium carbide (SiGeC), gallium arsenic phosphide (GaAsP) or gallium indium phosphide (GaInP)), any other applicable semiconductor, or a combination thereof.

In some embodiments, the substrate 10 is a semiconductor-on-insulator (SOI) substrate. For example, the substrate 10 may be a silicon-on-insulator substrate or a germanium-on-insulator substrate, but the present disclosure is not limited thereto. In some embodiments, the substrate 10 is a semiconductor wafer (e.g., a silicon wafer, or any other applicable semiconductor wafer). In some embodiments, the substrate 10 includes various conductive features (e.g., conductive lines or vias). For example, the conductive features may be made of aluminum (Al), copper (Cu), tungsten (W), an alloy thereof, any other applicable conductive material, or a combination thereof, but the present disclosure is not limited thereto.

As shown in FIG. 1, in some embodiments, the substrate 10 has a plurality of photoelectric conversion elements 11. For example, the photoelectric conversion elements 11 may be formed by a process such as an ion implantation process and/or a diffusion process. Moreover, the photoelectric conversion elements 11 may be configured to form transistors, photodiodes, PIN diodes and/or light-emitting diodes, but the present disclosure is not limited thereto. In some embodiments, the photoelectric conversion elements 11 form an array structure.

Referring to FIG. 1, in some embodiments, the semiconductor device 100 includes a first light-shielding layer 21 disposed on the substrate 10. As shown in FIG. 1, the first light-shielding layer 21 may be stacked on and in direct contact with the substrate 10, but the present disclosure is not limited thereto. In some embodiments, the first light-shielding layer 21 has first apertures 21H that correspond to the photoelectric conversion elements 11. For example, the first light-shielding layer 21 may include a metal, such as tungsten (W), copper (Cu), silver (Ag), and so on, but the present disclosure is not limited thereto. Moreover, the first light-shielding layer 21 may include photoresist (e.g., black photoresist, or other applicable photoresist which is not transparent), ink (e.g., black ink, or other applicable ink which is not transparent), molding compound (e.g., black molding compound, or other applicable molding compound which is not transparent), solder mask (e.g., black solder mask, or other applicable solder mask which is not transparent), (black) epoxy polymer, any other applicable material, or a combination thereof. In some embodiments, the first light-shielding layer 21 includes a light curing material, a thermal curing material, or a combination thereof.

The foregoing material may be deposited on the substrate 10 by a deposition process, such as physical vapor deposition (PVD), chemical vapor deposition (CVD), atomic layer deposition (ALD), molecular beam epitaxy (MBE), liquid phase epitaxy (LPE), the like, or a combination thereof. Then, a patterning process may be performed to pattern the material and form the first light-shielding layer 21 (that has first apertures 21H) as shown in FIG. 1. In more detail, some portions of the material may be removed in the patterning process to form the first apertures 21H. The patterning process may include soft baking, mask aligning, exposure, post-exposure baking, developing, rinsing, drying, any other applicable process, or a combination thereof, but the present disclosure is not limited thereto.

Referring to FIG. 1, in some embodiments, the semiconductor device 100 includes a light-adjusting structure 30 disposed on the first light-shielding layer 21. In some embodiments, the light-adjusting structure 30 is an infrared (IR) cut-off filter that has a multi-film structure. For example, the light-adjusting structure 30 may be capable of cutting the infrared light with the specific wavelength (e.g., about 700 nm to about 1,100 nm) and allowing the visible light with the specific wavelength (e.g., about 400 nm to about 700 nm) passing through, but the present disclosure is not limited thereto. The light-adjusting structure 30 may be formed by a deposition process. The examples of the deposition process are described above and will not be repeated herein, but the present disclosure is not limited thereto.

Referring to FIG. 1, in some embodiments, the semiconductor device 100 includes a second light-shielding layer 23 disposed on the light-adjusting structure 30. Similarly, in some embodiments, the second light-shielding layer 23 has second apertures 23H that correspond to the first apertures 21H. For example, the second light-shielding layer 23 and the first light-shielding layer 21 may include similar or the same material, but the present disclosure is not limited thereto. Moreover, the foregoing material may be deposited on the light-adjusting structure 30 by a deposition process, and then a patterning process may be performed to pattern the material and form the second light-shielding layer 23 (that has second apertures 23H) as shown in FIG. 1, but the present disclosure is not limited thereto.

Referring to FIG. 1, in some embodiments, the semiconductor device 100 includes first light-condensing structures 41 disposed on the second light-shielding layer 23. For example, the first light-condensing structures 41 may include a transparent material, such as glass, epoxy resin, silicone resin, polyurethane, any other applicable material, or a combination thereof, but the present disclosure is not limited thereto. The first light-condensing structures 41 may be formed by a photoresist reflow method, a hot embossing method, any other applicable method, or a combination thereof. Moreover, the steps of forming the first light-condensing structures 41 may include a spin coating process, a lithography process, an etching process, any other applicable process, or a combination thereof, but the present disclosure is not limited thereto.

In some embodiments, the first light-condensing structures 41 are convex micro-lenses that correspond to the second apertures 23H. As shown in FIG. 1, in some embodiments, the first light-condensing structures 41 cover the second apertures 23H. It should be noted that the central axis C1 of each first light-condensing structure 41 may be separated from the center of the corresponding second aperture 23H as shown in FIG. 1, but the present disclosure is not limited thereto.

Referring to FIG. 1, in some embodiments, the semiconductor device 100 includes a first light-transmitting layer 51 disposed on the second light-shielding 23. In particular, the first light-transmitting layer 51 may be stacked on and in direct contact with the second light-shielding 23 and the first light-condensing structures 41. In some embodiments, the refractive index of each first light-condensing structure 41 is higher than the refractive index of the first light-transmitting layer 51. In some embodiments, the refractive index of each first light-condensing structure 41 is between about 1.5 and about 2.5 (e.g., 1.7), and the refractive index of the first light-transmitting layer 51 is between about 1.4 and about 1.6 (e.g., 1.5).

The material of the first light-transmitting layer 51 may include transparent photoresist, polyimide, epoxy resin, any other applicable material, or a combination thereof, but the present disclosure is not limited thereto. For example, a spin-on coating process may be performed to coat the forgoing material on the second light-shielding 23 and the first light-condensing structures 41 to form the first light-transmitting layer 51, but the present disclosure is not limited thereto.

Referring to FIG. 1, in some embodiments, the semiconductor device 100 includes a third light-shielding layer 25 disposed on the first light-transmitting layer 51 and the first light-condensing structure 41. That is, the first light-transmitting layer 51 is disposed between the second light-shielding layer 23 and the third light-shielding layer 25.

Similarly, in some embodiments, the third light-shielding layer 25 has third apertures 25H that correspond to the second apertures 23H. For example, the third light-shielding layer 25, the first light-shielding layer 21, and the second light-shielding layer 23 may include similar or the same material, but the present disclosure is not limited thereto. Moreover, the foregoing material may be deposited on the first light-transmitting layer 51 by a deposition process, and then a patterning process may be performed to pattern the material and form the third light-shielding layer 25 (that has third apertures 25H) as shown in FIG. 1, but the present disclosure is not limited thereto.

Referring to FIG. 1, in some embodiments, the semiconductor device 100 includes second light-condensing structures 43 disposed on the third light-shielding layer 25. In some embodiments, the second light-condensing structures 43 include a transparent material, but are different from the first light-condensing structures 41. That is, the refractive index of each first light-condensing structure 41 and the refractive index of each second light-condensing structure 43 are different. For example, the refractive index of each second light-condensing structure 43 may between about 1.2 and about 1.5 (e.g., 1.4), but the present disclosure is not limited thereto. The second light-condensing structure 43 may be formed by a similar method or process of forming the first light-condensing structures 41, but the present disclosure is not limited thereto.

In some embodiments, the second light-condensing structures 43 are convex micro-lenses that correspond to the third apertures 25H. As shown in FIG. 1, in some embodiments, the second light-condensing structures 43 cover the third apertures 25H. Moreover, the third apertures 25H may be filled with the second light-condensing structures 43. It should be noted that the central axis C3 of each second light-condensing structure 43 may overlap the center of the corresponding third aperture 25H as shown in FIG. 1, but the present disclosure is not limited thereto.

As shown in FIG. 1, in some embodiments, the first light-transmitting layer 51 is in direct contact with the second light-shielding layer 23, the first light-condensing structures 41, the third light-shielding layer 25, and the second light-condensing structures 43. That is, the second light-shielding layer 23, the first light-condensing structures 41, the first light-transmitting layer 51, the third light-shielding layer 25, and the second light-condensing structures 43 may be stacked on each other.

As shown in FIG. 1, in some embodiments, the central axis C1 of each first light-condensing structure 41 is separated from the central axis C3 of each second light-condensing structure 43 (or the corresponding second light-condensing structure 43). In some embodiments, each photoelectric conversion element 11 corresponds to one first light-condensing structure 41 and one second light-condensing structure 43. It should be noted that the photoelectric conversion element 11a may corresponds to one first light-condensing structure 41 and one second light-condensing structure 43 which are not shown in the cross-sectional view of FIG. 1.

As shown in FIG. 1, in some embodiments, each first light-condensing structure 41 and each second light-condensing structure 43 have (semi-)spherical surfaces. In some other embodiments, each first light-condensing structure 41 and each second light-condensing structure 43 have aspherical or freeform surfaces.

As shown in FIG. 1, in some embodiments, the semiconductor device further includes a second light-transmitting layer 53 disposed between the light-adjusting structure 30 and the second light-shielding layer 23. In particular, the second light-transmitting layer 53 may be stacked on and in direct contact with the light-adjusting structure 30, but the present disclosure is not limited thereto. The material and the forming method of the second light-transmitting layer 53 may be the same as or similar to those of the first light-transmitting layer 51, but the present disclosure is not limited thereto.

As shown in FIG. 1, in some embodiments, the photoelectric conversion elements 11 are used for sensing incident lights L, and each incident light L has an incident angle θ in the range of about 1 degree to about 80 degrees. In some embodiments, each incident light L passes through at least two light-condensing structures (e.g., one first light-condensing structure 41 and one second light-condensing structure 43) and one light-transmitting layer between the two light-condensing structures (e.g., first light-transmitting layer 51), and the refractive index of the lower light-condensing structure and the refractive index of the light-transmitting layer are different. Even when the inclined incident light has larger incident angle (e.g., more than 50 degrees), the (comatic) aberrations may be effectively reduced, resulting in a higher quality image signal from the photoelectric conversion elements 11 of the semiconductor device 100.

Figure 2:
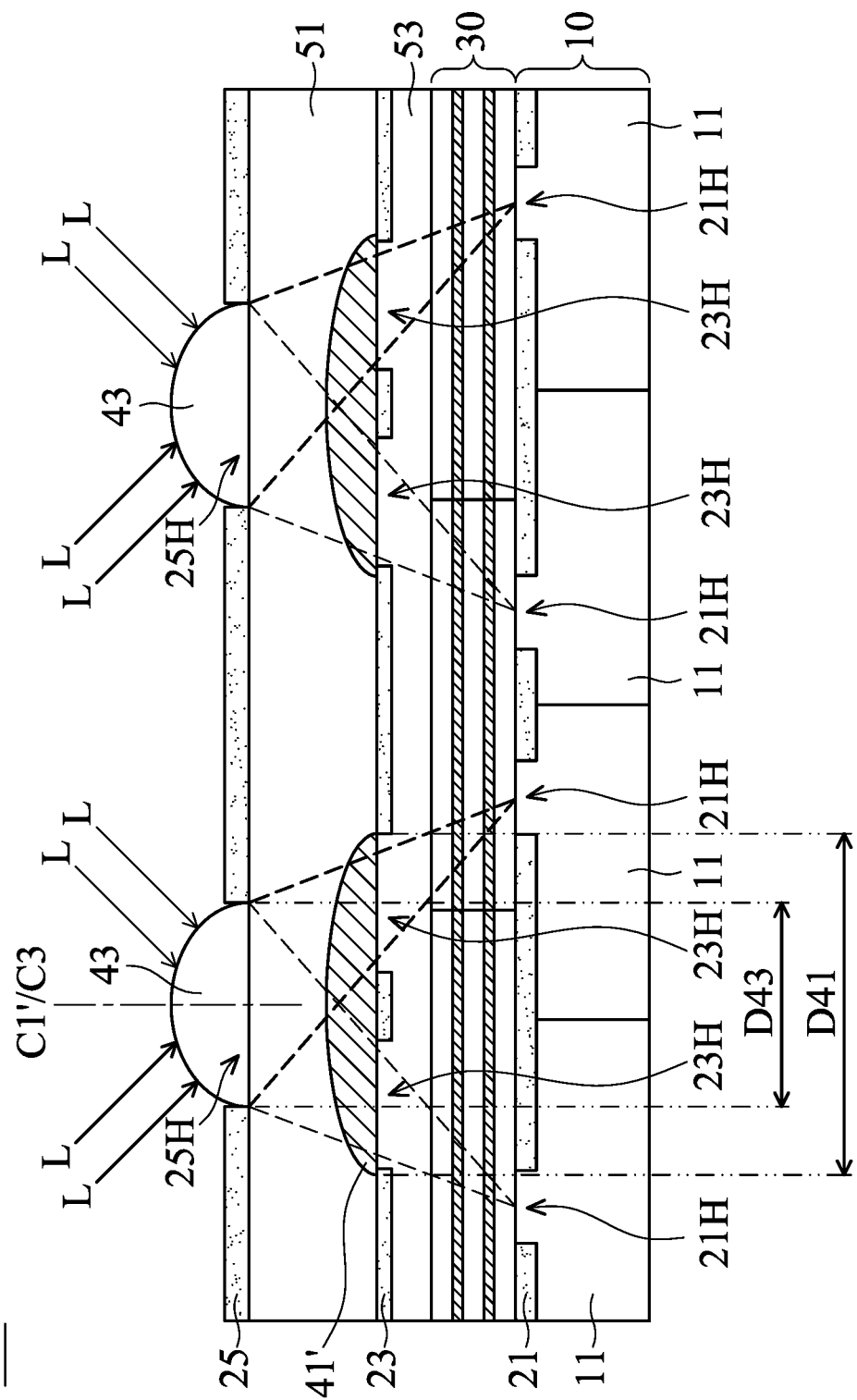
FIG. 2 is a partial cross-sectional view illustrating a semiconductor device according to another embodiment of the present disclosure.

FIG. 2 is a partial cross-sectional view illustrating a semiconductor device 102 according to another embodiment of the present disclosure. It should be noted that some components of the semiconductor device 102 may be omitted in FIG. 2, for the sake of brevity.

Referring to FIG. 2, the semiconductor device 102 includes a substrate 10 having photoelectric conversion elements 11. The semiconductor device 102 also includes a first light-shielding layer 21 disposed on the substrate 10 and having first apertures 21H corresponding to the photoelectric conversion elements 11. The semiconductor device 102 further includes a light-adjusting structure 30 disposed on the first light-shielding layer 21. Moreover, the semiconductor device 102 includes a second light-shielding layer 23 disposed on the light-adjusting structure 30 and having second apertures 23H corresponding to the first apertures 21H. The semiconductor device 102 also includes first light-condensing structures 41' disposed on the second light-shielding layer 23 and covering the second apertures 23H. The semiconductor device 102 further includes a third light-shielding layer 25 disposed on the first light-condensing structure 41' and having third apertures 25H corresponding to the second apertures 23H. Furthermore, the semiconductor device 102 includes second light-condensing structures 43 disposed on the third light-shielding layer 25 and covering the third apertures 25H. The semiconductor device 102 also includes a first light-transmitting layer 51 disposed between the second light-shielding layer 23 and the third light-shielding layer 25.

In this embodiment, the refractive index of each first light-condensing structure 41' is higher than the refractive index of the first light-transmitting layer 51, the first light-condensing structures 41' are convex micro-lenses that correspond to the second apertures 23H, and the second light-condensing structures 43 are convex micro-lenses that correspond to the third apertures 25H.

As shown in FIG. 2, in some embodiments, each first light-condensing structure 41' covers at least two second apertures 23H, and each second light-condensing structure 43 covers one third apertures 25H. Moreover, as shown in FIG. 2, in some embodiments, the central axis C1' of each first light-condensing structure 41' overlaps the central axis C3 of the corresponding second light-condensing structure 43.

As shown in FIG. 2, in some embodiments, each first light-condensing structure 41' corresponds to one third aperture 25H. In some embodiments, the diameter D41 of each first light-condensing structure 41' is greater than the diameter D43 of each second light-condensing structure 43 (the corresponding second light-condensing structure 43). That is, in some embodiments, two or more photoelectric conversion elements 11 share the same first light-condensing structure 41' and second light-condensing structure 43.

Figure 3:
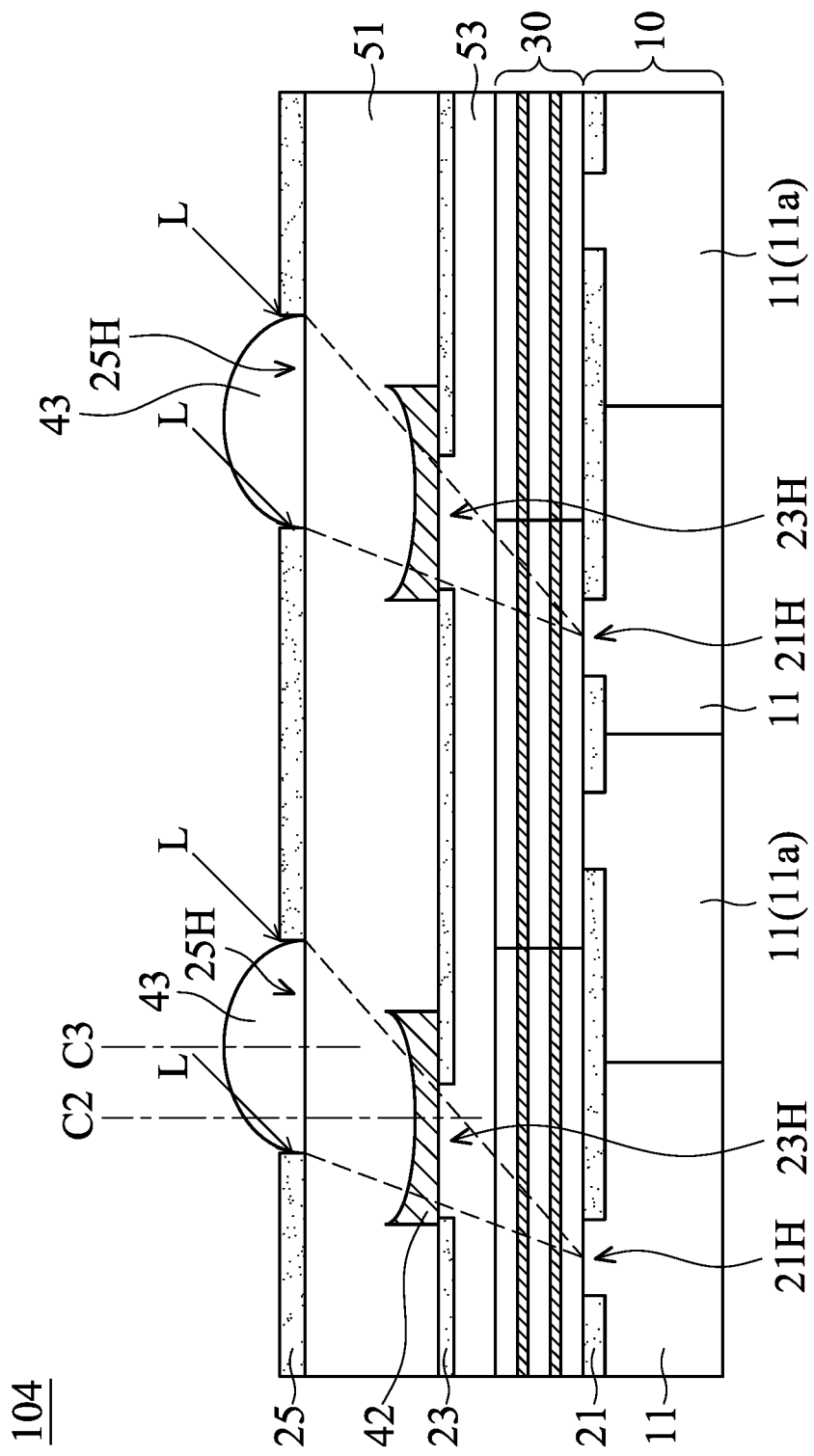
FIG. 3 is a partial cross-sectional view illustrating a semiconductor device according to an embodiment of the present disclosure.

FIG. 3 is a partial cross-sectional view illustrating a semiconductor device 104 according to an embodiment of the present disclosure. It should be noted that some components of the semiconductor device 104 may be omitted in FIG. 3, for the sake of brevity.

In some embodiment, the refractive index of each first light-condensing structure 42 is lower than the refractive index of the first light-transmitting layer 51. In this embodiments, the refractive index of each first light-condensing structure 42 is between about 1.0 and about 1.5 (e.g., 1.3), and the refractive index of the first light-transmitting layer 51 is between about 1.4 and about 1.6 (e.g., 1.5).

As shown in FIG. 3, in some embodiments, the first light-condensing structures 42 are concave micro-lenses that correspond to the second apertures 23H, and the second light-condensing structures 43 are convex micro-lenses that correspond to the third apertures 25H.

Similarly, as shown in FIG. 3, in some embodiments, the central axis C2 of each first light-condensing structure 42 is separated from the central axis C3 of each second light-condensing structure 43 (or the corresponding second light-condensing structure 43). In some embodiments, each photoelectric conversion element 11 corresponds to one first light-condensing structure 42 and one second light-condensing structure 43. It should be noted that the photoelectric conversion element 11a may corresponds to one first light-condensing structure 42 and one second light-condensing structure 43 which are not shown in the cross-sectional view of FIG. 3.

Figure 4:
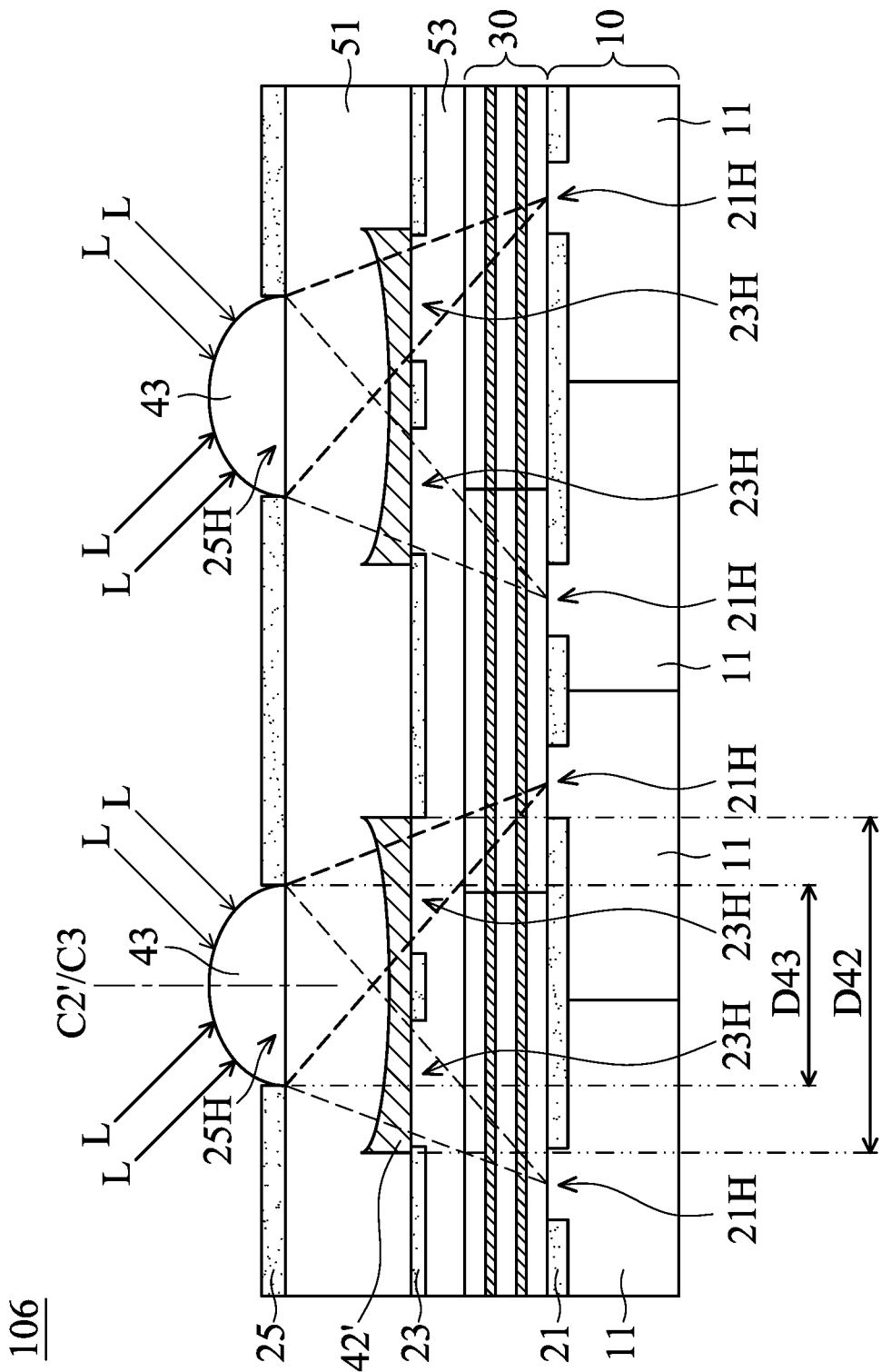
FIG. 4 is a partial cross-sectional view illustrating a semiconductor device according to another embodiment of the present disclosure.

FIG. 4 is a partial cross-sectional view illustrating a semiconductor device 106 according to another embodiment of the present disclosure. It should be noted that some components of the semiconductor device 106 may be omitted in FIG. 4, for the sake of brevity.

In this embodiment, the refractive index of each first light-condensing structure 42' is lower than the refractive index of the first light-transmitting layer 51, the first light-condensing structures 42' are concave micro-lenses that correspond to the second apertures 23H, and the second light-condensing structures 43 are convex micro-lenses that correspond to the third apertures 25H.

As shown in FIG. 4, in some embodiments, each first light-condensing structure 42' covers at least two second apertures 23H, and each second light-condensing structure 43 covers one third apertures 25H. Moreover, as shown in FIG. 4, in some embodiments, the central axis C2' of each first light-condensing structure 42' overlaps the central axis C3 of the corresponding second light-condensing structure 43.

As shown in FIG. 4, in some embodiments, each first light-condensing structure 42' corresponds to one third aperture 25H. In some embodiments, the diameter D42 of each first light-condensing structure 42' is greater than the diameter D43 of each second light-condensing structure 43 (the corresponding second light-condensing structure 43). That is, in some embodiments, two or more photoelectric conversion elements 11 share the same first light-condensing structure 42' and second light-condensing structure 43.

In summary, the semiconductor device according to some embodiments of the present disclosure includes at least two light-condensing structures and one light-transmitting layer between the two light-condensing structures, and the refractive index of the lower light-condensing structure and the refractive index of the light-transmitting layer are different, so that the (comatic) aberrations may be effectively reduced, thereby improving the quality of the image signal from the photoelectric conversion elements of the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A semiconductor device, comprising:
   a substrate having photoelectric conversion elements;
   a first light-shielding layer disposed on the substrate and having first apertures corresponding to the photoelectric conversion elements;
   an infrared cut-off filter disposed on the first light-shielding layer;
   a second light-shielding layer disposed on the infrared cut-off filter and having second apertures corresponding to the first apertures;
   first light-condensing structures disposed on the second light-shielding layer and covering the second apertures;
   a third light-shielding layer disposed on the first light-condensing structure and having third apertures corresponding to the second apertures;
   second light-condensing structures disposed on the third light-shielding layer and covering the third apertures; and
   a first light-transmitting layer disposed between the second light-shielding layer and the third light-shielding layer;
   wherein the first light-shielding layer, the infrared cut-off filter, the second light-shielding layer, the third light-shielding layer and the first light-transmitting layer are stacked on each other and extended in parallel;
   wherein a refractive index of each of the first light-condensing structures and a refractive index of the first light-transmitting layer are different;
   wherein the refractive index of each of the first light-condensing structures and a refractive index each of the second light-condensing structures are different, wherein the refractive index of each of the first light-condensing structures is higher than a refractive index each of the second light-condensing structures;
   wherein the infrared cut-off filter is disposed between the first light-shielding layer and the second light-shielding and covers the first apertures of the first light-shielding layer;
   wherein a center of one of the first apertures is separated from a center of one of the second apertures corresponding to the one of the first apertures, and the center of the one of the second apertures is separated from a center of one of the third apertures corresponding to the one of the second apertures;
   wherein each of the first light-condensing structures covers at least two of the second apertures.

2. The semiconductor device as claimed in claim 1, wherein the refractive index of each of the first light-condensing structures is higher than the refractive index of the first light-transmitting layer.

3. The semiconductor device as claimed in claim 2, wherein the first light-condensing structures are convex micro-lenses.

4. The semiconductor device as claimed in claim 2, wherein the refractive index of each of the first light-condensing structures is between 1.5 and 2.5.

5. The semiconductor device as claimed in claim 1, wherein the refractive index of each of the first light-condensing structures is lower than the refractive index of the first light-transmitting layer.

6. The semiconductor device as claimed in claim 5, wherein the first light-condensing structures are concave micro-lenses.

7. The semiconductor device as claimed in claim 5, wherein the refractive index of each of the first light-condensing structures is between 1.0 and 1.5.

8. The semiconductor device as claimed in claim 1, wherein a central axis of each of the first light-condensing structures is separated from a central axis of each of the second light-condensing structures.

9. The semiconductor device as claimed in claim 1, wherein each of the photoelectric conversion elements corresponds to one of the first light-condensing structures and one of the second light-condensing structures.

10. The semiconductor device as claimed in claim 1, wherein each of the first light-condensing structures covers one of the second apertures.

11. The semiconductor device as claimed in claim 1, wherein a central axis of each of the first light-condensing structures overlaps a central axis of a corresponding one of the second light-condensing structures.

12. The semiconductor device as claimed in claim 1, wherein each of the first light-condensing structures corresponds to one of the third apertures.

13. The semiconductor device as claimed in claim 1, wherein a diameter of each of the first light-condensing structures is greater than a diameter of each of the second light-condensing structures.

14. The semiconductor device as claimed in claim 1, further comprising:
a second light-transmitting layer disposed between the infrared cut-off filter and the second light-shielding layer.

15. The semiconductor device as claimed in claim 1, wherein the first light-transmitting layer is in direct contact with the second light-shielding layer, the first light-condensing structures, the third light-shielding layer, and the second light-condensing structures.

16. The semiconductor device as claimed in claim 1, wherein each of the first light-condensing structures and each of the second light-condensing structures have spherical, aspherical, or freeform surfaces.

17. The semiconductor device as claimed in claim 1, wherein the photoelectric conversion elements are used for sensing incident lights, and each of the incident lights has an incident angle in a range of 1 degree to 80 degrees.

18. A semiconductor device, comprising:
a substrate having photoelectric conversion elements;
a first light-shielding layer disposed on the substrate and having first apertures corresponding to the photoelectric conversion elements;
a light-adjusting structure disposed on the first light-shielding layer;
a second light-shielding layer disposed on the light-adjusting structure and having second apertures corresponding to the first apertures;
first light-condensing structures disposed on the second light-shielding layer and covering the second apertures;
a third light-shielding layer disposed on the first light-condensing structure and having third apertures corresponding to the second apertures;
second light-condensing structures disposed on the third light-shielding layer and covering the third apertures; and
a first light-transmitting layer disposed between the second light-shielding layer and the third light-shielding layer;
wherein a refractive index of each of the first light-condensing structures and a refractive index of the first light-transmitting layer are different;
wherein each of the first light-condensing structures covers at least two of the second apertures.

19. The semiconductor device as claimed in claim 18, wherein each of the first light-condensing structures corresponds to one of the third apertures.

20. The semiconductor device as claimed in claim 18, wherein a diameter of each of the first light-condensing structures is greater than a diameter of each of the second light-condensing structures.

* * * * *